United States Patent
Downey

(10) Patent No.: US 9,606,633 B2
(45) Date of Patent: Mar. 28, 2017

(54) METHOD AND APPARATUS FOR INPUT TO ELECTRONIC DEVICES

(71) Applicant: John W. Downey, Fairfax, VA (US)

(72) Inventor: John W. Downey, Fairfax, VA (US)

( * ) Notice: Subject to any disclaimer, the term of this patent is extended or adjusted under 35 U.S.C. 154(b) by 46 days.

(21) Appl. No.: 14/708,168

(22) Filed: May 8, 2015

(65) Prior Publication Data

US 2016/0328024 A1    Nov. 10, 2016

(51) Int. Cl.
*G06F 3/033* (2013.01)
*G06F 3/023* (2006.01)
*H01H 13/705* (2006.01)

(52) U.S. Cl.
CPC ........... *G06F 3/023* (2013.01); *H01H 13/705* (2013.01); *H01H 2221/036* (2013.01); *H01H 2231/022* (2013.01)

(58) Field of Classification Search
CPC .... G06F 3/023; G01C 19/5783; H01H 13/705
USPC ....... 345/156–184; 715/773, 856; 455/456.1; 200/513
See application file for complete search history.

(56) References Cited

U.S. PATENT DOCUMENTS

| | | | |
|---|---|---|---|
| 2002/0140668 A1 | 10/2002 | Crawford | |
| 2003/0107547 A1 | 6/2003 | Kehlstadt et al. | |
| 2005/0009481 A1* | 1/2005 | Bushner | H04N 21/42684 455/132 |
| 2006/0202954 A1* | 9/2006 | Ho | G06F 3/03547 345/156 |
| 2006/0282791 A1* | 12/2006 | Bogomolov | G06F 3/0236 715/773 |
| 2008/0079609 A1* | 4/2008 | Kallqvist | H04M 1/274558 341/22 |
| 2010/0306691 A1* | 12/2010 | Ardhanari | G06F 3/04895 715/773 |
| 2011/0132181 A1* | 6/2011 | Kockovic | G10H 1/34 84/723 |
| 2011/0161889 A1* | 6/2011 | Scheer | G06F 3/04815 715/863 |
| 2011/0199305 A1 | 8/2011 | Suh | |
| 2012/0075168 A1* | 3/2012 | Osterhout | G02B 27/017 345/8 |
| 2012/0105358 A1* | 5/2012 | Momeyer | G06F 3/0414 345/174 |

(Continued)

*Primary Examiner* — Prabodh M Dharia

(57) ABSTRACT

The method and apparatus for input to electronic devices include a control circuit and a gyro module. The control circuit includes a microcontroller, where the microcontroller includes a digital bus, a receiver/transmitter module, a plurality of digital input pins, and an analog input pin. The gyro module is connected to the digital bus. The apparatus further includes a plurality of tactile switches connected to the digital pins. Further, a force sensitive resistor and a vibration motor interact with the control circuit. The force sensitive resistor is connected to the analog input pin of the microcontroller through a voltage divider, and the vibration motor is connected to the digital bus of the microcontroller through a motor controller. The apparatus also includes a communications antenna that is connected to the receiver/transmitter module of the microcontroller through a wireless module. A method includes various steps for inputting into an electronic device.

15 Claims, 5 Drawing Sheets

(56) References Cited

U.S. PATENT DOCUMENTS

| | | | | |
|---|---|---|---|---|
| 2012/0206248 A1* | 8/2012 | Biggs | ............... | G06F 3/016 340/407.2 |
| 2012/0293551 A1* | 11/2012 | Momeyer | ............ | G06F 3/0488 345/633 |
| 2013/0135220 A1* | 5/2013 | Alameh | ............... | G06F 3/041 345/173 |
| 2013/0335373 A1* | 12/2013 | Tomiyasu | ............... | G06F 3/016 345/174 |
| 2013/0336138 A1* | 12/2013 | Venkatraman | ......... | H04W 4/02 370/252 |
| 2014/0004548 A1* | 1/2014 | Gordon | ............... | B01L 3/5029 435/21 |
| 2014/0181163 A1* | 6/2014 | Pang | ............... | G06F 15/02 708/131 |
| 2014/0195985 A1* | 7/2014 | Yoon | ............... | G06F 17/24 715/856 |
| 2014/0206253 A1* | 7/2014 | Huyck | ............... | A63H 30/04 446/175 |
| 2014/0223553 A1* | 8/2014 | Gupta | ............... | G06F 21/52 726/22 |
| 2014/0267104 A1* | 9/2014 | Ahmed | ............... | G06F 3/041 345/173 |
| 2014/0300571 A1* | 10/2014 | Tomizu | ............... | G06F 3/0416 345/173 |
| 2014/0308973 A1* | 10/2014 | Garin | ............... | H04W 4/023 455/456.1 |
| 2015/0124396 A1* | 5/2015 | Ivanchenko | ......... | G06F 1/1632 361/679.41 |
| 2015/0279589 A1* | 10/2015 | Park | ............... | H01H 13/14 200/513 |
| 2016/0048266 A1* | 2/2016 | Smith | ............... | G06F 3/0418 345/174 |
| 2016/0235239 A1* | 8/2016 | Patadia | ............... | A47J 44/00 |

* cited by examiner

Primary Key Layout

| z @ x | r : p | i 7 g |
| --- | --- | --- |
| v ! t | n . l | e 3 c |
| ' , ; " | ) / j * ( | 9 5 a 4 8 |
| s ? u | k ÷ m | b 2 d |
| w # y | o = q | f 6 h |
| Ring | Middle | Index |

*Fig. 2A*

Alternate Key Layout

| ' z @ | ) r : | 9 i 7 |
| --- | --- | --- |
| , v ! | / n - | 5 c 3 |
| w s . t x | o k 0 l p | f b 1 c g |
| ? u ; | + m * | 2 d 4 |
| # y " | = p ( | 6 h 8 |
| Ring | Middle | Index |

*Fig. 2B*

METHOD AND APPARATUS FOR INPUT TO ELECTRONIC DEVICES

BACKGROUND OF THE INVENTION

1. Field of the Invention

The present invention relates to electronic keypads and remote controls, and particularly to a method and apparatus for input to electronic devices.

2. Description of the Related Art

Input devices, such as computer keyboards, can be designed for use at a desk or at a workstation. These input devices are generally of such a size and shape to allow for relatively large-size keys. These relatively larger keys can be easier for a user to interact with and manipulate. On the other hand, certain input devices, for example those found in cellular phones, are generally smaller in size. These relatively smaller input devices can be considered to have diminished usability, because their size and shape may not allow for relatively appropriate size keys. Further, it may not be possible to place a large number of keys on a smaller input device without making keys so small that they are difficult to operate. Additionally, speed of operation can reduced in these smaller input devices, since it can be easy to press the wrong key by accident. In addition, for these smaller input devices, users may need to look down continually at the electronic device in order to operate it.

Thus, a method and apparatus for input to electronic devices solving the aforementioned problems is desired.

SUMMARY OF THE INVENTION

The apparatus for input to electronic devices has control circuitry including a gyro module, where the control circuitry further includes a microcontroller. The microcontroller includes such structures as a digital bus, a receiver/transmitter module, a plurality of digital input pins, and an analog input pin. The gyro module is connected to the microcontroller through the digital bus. The apparatus further includes a plurality of tactile switches, where the tactile switches can interact with the control circuitry by connection to the digital input pins. Further, a force sensitive resistor and a vibration motor interact with the control circuitry. The force sensitive resistor is connected to the analog input pin of the microcontroller through a voltage divider, and the vibration motor is connected to the digital bus of the microcontroller through a motor controller. Additionally, the apparatus for input includes a communications antenna, where the communications antenna is connected to the receiver/transmitter module of the microcontroller through a wireless module. A method for inputting into an electronic device includes the steps of pressing a key on the electronic device to highlight a character, and holding the key to maintain engagement of the highlighted character. Further, the method includes the steps of moving the electronic device in a field of direction, where each movement corresponds to character selection so that the highlighted character continues to be highlighted or so that a different character is highlighted. An additional step involves releasing the key to select the character.

These and other features of the present invention will become readily apparent upon further review of the following specification and drawings.

BRIEF DESCRIPTION OF THE DRAWINGS

FIG. 2A is a diagrammatic top view of a first embodiment of on-screen keys for an apparatus for input to electronic devices according to the present invention.

FIG. 2B is a diagrammatic top view of a second embodiment of on-screen keys for an apparatus for input to electronic devices according to the present invention.

Similar reference characters denote corresponding features consistently throughout the attached drawings.

DETAILED DESCRIPTION OF THE PREFERRED EMBODIMENTS

The method and apparatus for input to electronic devices provides a mechanism for a user to operate and control various electronic devices. For example, the method and apparatus allows a user to input text and control a handheld device, such as a mobile phone. The method and apparatus can allow for typing using a reduced number of keys, for example, as compared to a traditional keyboard. The method and apparatus operate by allowing keys to move along with fingers, rather than moving the fingers to the position of the keys. Thus, the fingers and keys are moved together using simple movements of the hand. Each finger remains positioned over and operates one key during interaction with the input apparatus, Additionally, the method and apparatus for input depends on movement generated by the user. These movements can be accomplished in various manners by the user, for example by the bending or the rotation of the user's wrist.

Specific press and rotate movements are assigned coded character values such that the same movement always results in the same character being generated or selected. Through repetition these movements can be committed to muscle memory, which is generally the same mechanism that allows rapid touch typing on a standard keyboard. The method and apparatus for input to electronic devices can be implemented to control not only smart TV remotes and mobile phones, but also to provide input and control for tablets, desktop computers, game consoles, media streaming devices, smart glasses, home automation, hand scanners, smart wearables, two-way texters, and handheld computers, among other electronic devices.

Referring to FIGS. 1-5, embodiments of a method and apparatus for input to electronic devices are shown. The method and apparatus for input to electronic devices allows a user to operate and control an electronic device by recognizing press and rotate (PAR) gestures and converting them into character codes for key presses or sets of vector values for control functions. An individual PAR gesture can be accomplished through the simultaneous pressing of a button and bending or rotation of a user's wrist. The button press may have additional characteristics of a press amount. A press amount can be considered the amount of force applied by the finger operating the button or the distance the finger moves.

Figure 1:
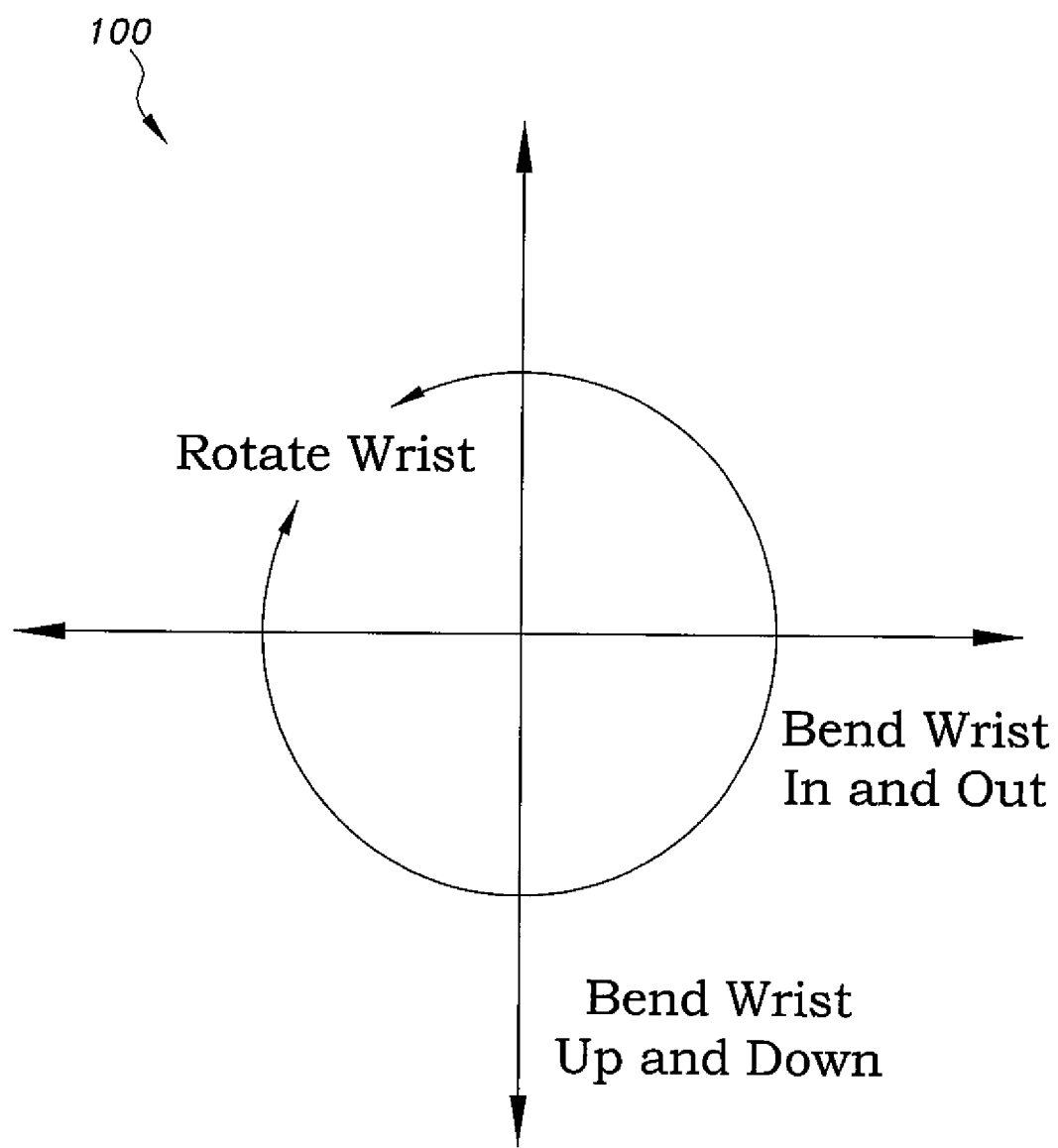
FIG. 1 is a schematic diagram of selected wrist movements for controlling input in a method and apparatus for input to electronic devices according to the present invention.

Referring to FIG. 1, a field of direction 100 is shown. Three distinct bidirectional rotations can be recognized for keyboard operation. These three distinct bidirectional rotations can be in/out twist, in/out bend, and up/down bend, as illustrated by the field of direction 100 in FIG. 1. By distinguishing two rotation distances in each direction of rotation, each key, such as key 306 and 406, can produce twelve unique values. Additionally, adding recognition of a press with no rotation brings the number to thirteen.

Table 1 below shows a possible mapping of all the letters of the Latin alphabet, plus the space character to three keys using two distances of eight movements. The values can represent character symbols, command actions, or any other selectable items.

TABLE 1

Sample Character Mapping

| Motion | Key 1 | Key 2 | Key 3 |
| --- | --- | --- | --- |
| No Rotation | a | j | space |
| Rotate In | b | k | s |
| Rotate Out | c | l | t |
| Bend In | d | m | u |
| Bend Out | e | n | v |
| Rotate In 2 | f | o | w |
| Rotate Out 2 | g | p | x |
| Bend In 2 | h | q | y |
| Bend Out 2 | i | r | z |

The method and apparatus for input to electronic devices can operate by tracking changes in the orientation of the user's hand while a force is being applied by the user to a button. This button can be a physical button or a virtual button, depending on the user's needs. For virtual buttons, finger movement can imply the button force. This information can be converted into numeric codes that are sent as an input to a computer, processor, controller, or other intelligent device. The application of force on a button in combination with a change of orientation of the electronic device can constitute what is referred to as a press gesture. Press gestures can be closed or open-ended. Both closed and open-ended press gestures can be initiated by an increase of force applied to a button.

A closed gesture is complete when a press force is released and results in a coded value being sent to the host computer or computer application. A closed gesture can allow a single button to replace multiple keys of a computer board. On the other hand, an open-ended gesture is paused when the press force is released and resumes when a force is reapplied. Open-ended gestures can provide a superset of the functionality of pointing mechanisms, such as computer mice and touch screens. Open-ended gestures can result in a range of numeric values being sent to the host while the button remains in a pressed state. Multiple value sets are sent, which can represent the amount of force applied to any force-sensing button, plus the distance in direction and degree of the difference in orientation of the hand from its orientation at the time of a controlling button press.

Continuing with closed gestures, closed gestures select a single value from a finite set of values. A closed gesture is similar in function to the pressing of a key on a keyboard. The selected value represents some abstraction, such as a character, symbol, or command action. An abstract software object called a selector translates press gestures into the coded values. The values generated depend on which button is pressed and the difference in orientation of the device between the press and release of a button, and optionally, the amount of force applied to the button. Selectors have both visual and tactile representations that guide their use. A visual graphic presents a set of choices arranged around a central point. Using a selector to make a selection involves pressing a key, such as key 306 and 406, while moving the device in the direction of the desired choice, as visually represented. Therefore, as a user's hand moves, choices in the graphic representation are highlighted one at a time. Releasing the button while the choice is highlighted causes a coded value corresponding to that choice to be communicated to a host application.

Referring to FIGS. 2A and 2B, a primary use of closed gestures is to enable typing on a handheld device. As mentioned previously, a graphical screen element called a selector can make typing relatively easy and intuitive. As shown in keyboards 200a and 200b, characters can be arranged on a display in a configuration that can indicate required movements. The display can be various examples of a display, such as a computer monitor, a TV screen, augmented reality glasses, or a handheld device screen, among other examples. As shown in FIGS. 2A and 2B, keyboards 200a and 200b can be possible graphical representations of a "soft keyboard" that uses three selectors mapped to keys operated by three fingers.

Figure 4:
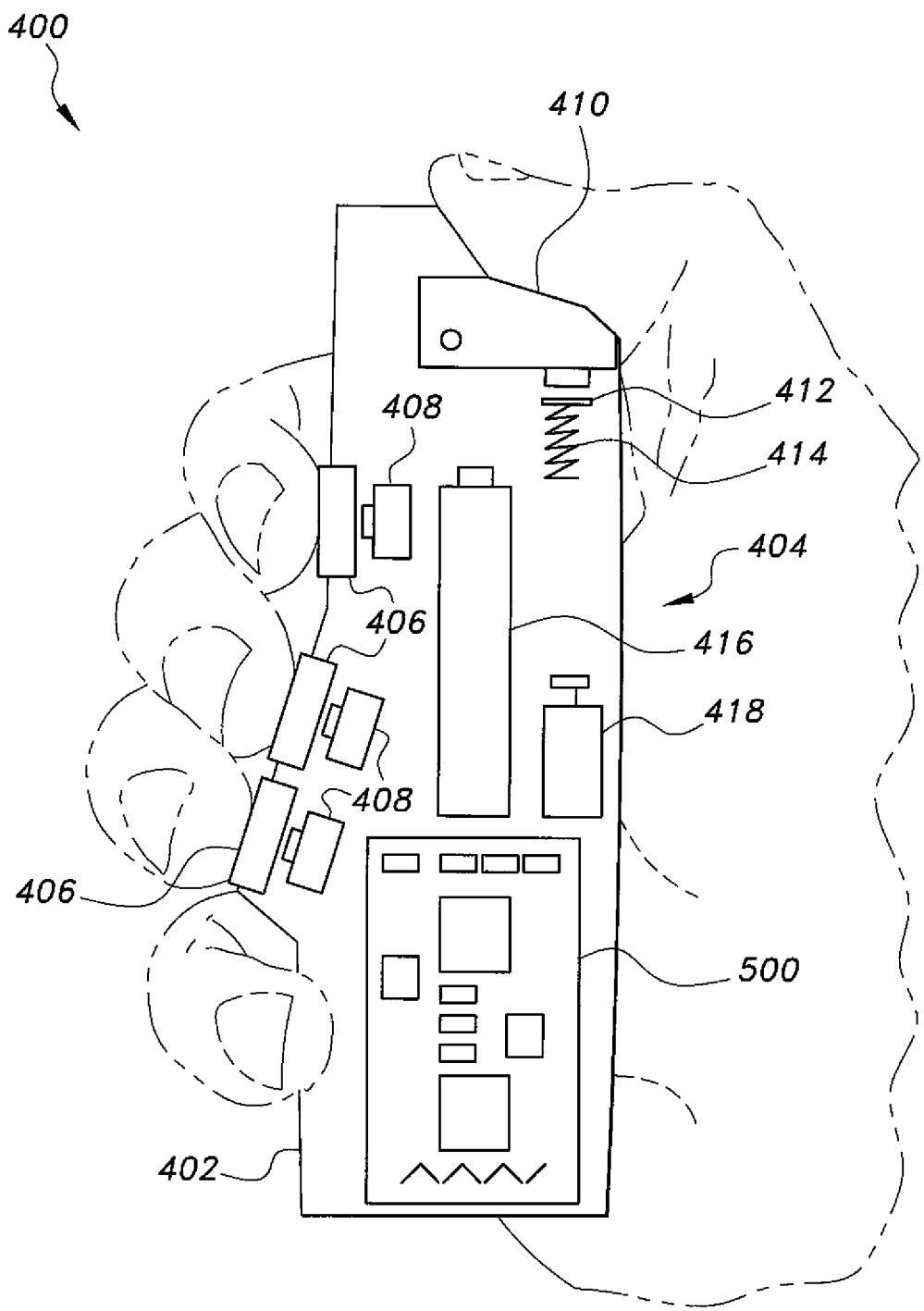
FIG. 4 is a schematic side view in section of a device having an apparatus for input to electronic devices according to the present invention.

Continuing with FIGS. 2A and 2B, the choices for each selector can be in a diagonal pattern corresponding to simple movements of the wrist. The letters along the forward sloping axis are individually highlighted as the wrist is rotated right or left while applying force to a key, such as key 306 or 406. The letters along the backward sloping axis are selected in a similar fashion, by bending the wrist in or out. A vibration motor, such as vibration motor 418 shown in FIG. 4, provides a tactile sound, such as a "click", each time a different letter is highlighted. Additionally, a light buzzing sound can warn when the device is being rotated in a direction that is far out of alignment with one of the two axes. These tactile clicks can provide feedback regarding the required amount of movement. These clicks and other tactile responses make it possible to operate the electronic device by feel alone.

As just mentioned, selectors can use tactile clues to allow them to be operated by feel. Tactile feedback can tell the user how far to rotate the device, and can also guide movements by the user into "tracks." One click from the vibration motor, such as vibration motor 418, signals the highlighting of a choice adjacent to the origin point, while the next choice away is signaled by a double click. Tactile feedback can allow for faster operation than visual feedback by the same principle that makes touch typing on a computer keyboard faster than using a touch screen. Frequently repeated operations, such as typing characters, can become committed to muscle memory, which can facilitate relatively quicker operation. In addition, with practice, the graphical display of selectors may be considered unnecessary, and typing, as well as command execution, can be done by feel alone. Additional selector types can use more sophisticated haptic cues to guide operation.

Continuing with keyboards 200a and 200b, the letter highlighted depends on the degree and direction of rotation. If the electronic device is not rotated, such as electronic device 302 and 402, the letter of the selector remains highlighted. A decreased press force on the button commits the highlighted letter, which is then communicated to a local or remote application. Since only two degrees of freedom are used for the typing function, the third degree of freedom, which involves moving the device in the third perpendicular dimension, is used to switch between alternate keyboards 200a and 200b.

Shifting to an alternative character set can be accomplished by pressing a key, such as key 306 or 406, and at the same time moving the wrist up and down. Selecting an alphabetic character while shifting selects the upper case form of the character. Selecting space and shifting selects an alternate keyset. The next available keyset is displayed as being greyed out in each selector. When shifted, the alternate characters take the place of the characters on the active axes, as illustrated in FIG. 2B. A shift motion in the opposite direction can return the previous character set to the active state.

Concerning selectors and selector types, press and rotate selection has other uses beyond typing. The same method can be used for executing commands in a windowing environment or selecting values from a menu. A large variety of designs and configurations are possible for the selectors. For example, a target selector might serve as a color chooser for sixteen color choices, plus black and white. A crosshair box selector might be used for selecting a tool in place of a toolbar. The crosshair box selector can work by highlighting a choice at the intersection of crosshairs that is moved by the bending and rotation of the wrist. The list selector can provide a cascading popup menu. An icon grid selector can be used for selecting an application to run on a computer home screen, or for selecting program content from a streaming service on a TV screen. Selectors are very intuitive to use, like graphical user interface (GUI) widgets, but are relatively much faster. They can be considered much faster, since it is not required to move a mouse cursor across the screen to operate it, since pressing a key always positions the highlight at the center of the graphic.

Figure 3:
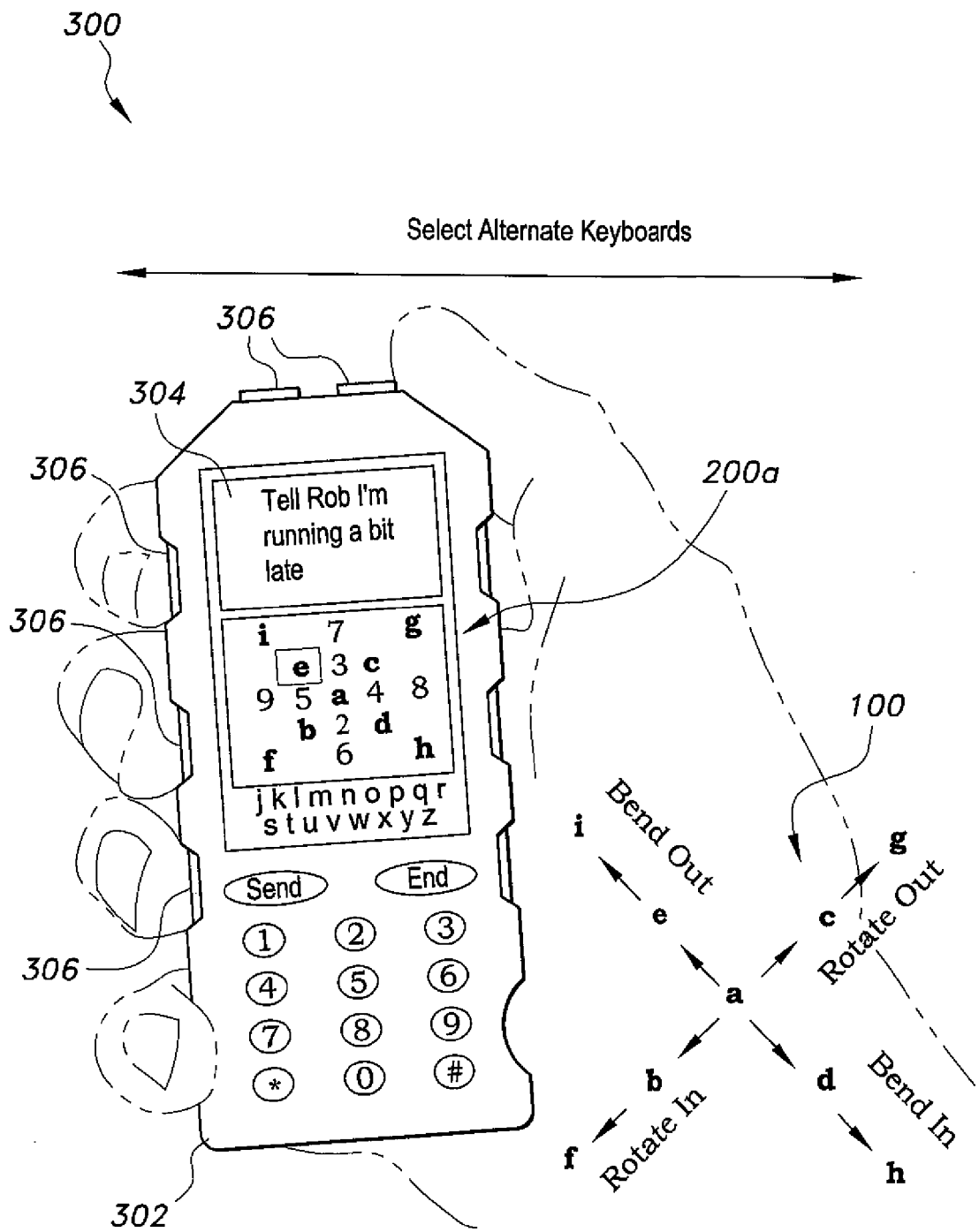
FIG. 3 is an environmental perspective view of a mobile phone having an apparatus for input to electronic devices according to the present invention.

Referring to FIG. 3, a mobile phone and input apparatus combination 300 is shown. The mobile phone and input apparatus combination 300 includes a mobile phone 302 and an input apparatus 304. As shown in FIG. 3, mobile phone and input apparatus combination 300 includes keyboard 200a. Additionally, FIG. 3 illustrates how the field of motion 100 can be implemented in controlling the mobile phone 302 by the input apparatus 304. As mentioned previously, the pressing of the keys 306 and the movement of the user's wrist in the field of direction 100 can allow for the control and operation of the input apparatus 304.

Continuing with FIG. 3, for this embodiment, to conserve space on the small screen, a single selector appears only when a key is pressed. The index, middle, and ring fingers of the user can each operate a different selector with a different set of characters. Pressing one of the three keys 306 causes the display of the selector for the pressed key. When pressed, an initial selected character is highlighted. As the hand is moved, the highlighted character changes to the new selected character. When the key 306 is released, the selected character is "typed." The figure shows the state of the selector after the index finger has been pressed and the wrist has been bent slightly outward, causing the 'e' character to be highlighted. Releasing the key at this point would type the letter 'e'. Bending the wrist more in the same direction before releasing the key 306 would cause the selection of the letter T. As shown in FIG. 3, a second set of keys 306 is positioned on the opposite side of the phone to allow for left-handed operation. Left-handed selectors are the mirror image of the right-handed selectors, so that in and out have the same meaning for both hands.

Referring to FIG. 4, a remote control and input apparatus combination 400 is shown. In addition to the remote control 402, the input apparatus 404, and the keys 406, the remote control and input apparatus combination 400 includes tactile switches 408. As shown in FIG. 4, the keys 406 are arranged so that they are positioned under the index, middle, and ring fingers of the user when the remote control and input apparatus combination 400 is held in the hand as illustrated. The remote control and input apparatus combination 400 can be used as an input device for a personal computer, a laptop, or a tablet. The remote control and input apparatus combination 400 can have opposing surfaces designed into the case so it may be grasped between the tip of the thumb and the side of the little finger, leaving the three other fingers free to operate the keys 406. The rear of the remote control and input apparatus combination 400 can rest on the palm of the hand to support the device, and also to prevent the device from moving when the keys 406 are pressed. A button 410 is positioned so that it can be pressed by the user's thumb while the tip still grasps the device.

Continuing with the keys 406, the tactile switches 408 are activated when a force is applied to any of the keys 406. The tactile switches 408 can be Dual Action Tactile Switches, which allows them the capability of sensing two levels of press force. The tactile switches 408 can allow a second set of symbols or commands to be mapped by the same buttons. For example, a firmer press of the keys 406 by the user can activate a second set of symbols. Further, selections can represent commands similar to those invoked with the control (ctrl) key two key combination shortcuts designed to speed up a graphical user interface (GUI) operations. The commands can be assigned so that there is a mnemonic relationship between the letter selected by a light press gesture, and a command is selected by the same gesture with a firm press. For example, a firm press after selecting the letter 'c' will invoke the copy function.

The button 410 can activate the pointer function. While the button 410 is pressed, hand movements can cause movement of a cursor on the display device and cause the three keys to function as mouse buttons. The resolution of the pointer movement is controlled by the firmness of the press of the thumb button. With a firmer press, the speed of the cursor can increase, while the resolution decreases correspondingly. A relatively lighter press can lock the cursor position while still leaving the mouse buttons active.

It should be noted that the remote control and input apparatus combination 400 is backwards compatible with existing command line and graphical user interfaces. Further, the remote control and input apparatus combination 400 can act as a human interface device (HID) and serve as a replacement for a keyboard and mouse. The ability to type via character selectors provides the ability to type commands. Additionally, open-ended press gestures can be used to position a pointer on a display. It should also be noted that detecting press amount and press rotation for the remote control and input apparatus combination 400 can be accomplished using a variety of means. For example, rotation can be calculated by sampling rotational force values provided by a gyro module, such as gyro module 512. Press amounts can be determined by sensors that convert press force into changes in resistance, capacitance, or inductance. Both rotation and press distance can be detected with a camera.

Continuing with FIG. 4, the button 410 under the user's thumb is arranged so that it applies the force exerted by the user onto a force sensitive resistor (FSR) 412 when the button 410 is pressed. As shown in FIG. 4, the force sensitive resistor 412 is held against the button 410 by the biasing force provided by spring 414. The force sensitive resistor 412 is connected to the analog input pin 510 of the control circuitry 500, shown in detail in FIG. 5. The force sensitive resistor 412 is connected to the analog input pin 510 through a voltage divider circuit 520 so that changes to the amount of force applied to the button 410 changes the voltage level on the analog input pin 510.

As shown in FIG. 4, the keys 406 are mechanically connected to force sensors that are implemented by the tactile switches 408. These tactile switches 408 are capable of distinguishing three levels of press force: unpressed, half-press, and full-press. As mentioned previously, these tactile switches 408 can provide tactile feedback by a click as the switch changes from unpressed to half-press, and half-press to full-press, for example. Each tactile switch 408 is connected to two digital input pins 508 of the microcontroller 502, shown in FIG. 5. These digital input pins 508 are normally high. The tactile switches 408 are wired so that a light press will bring the state of one of the lines low, while a firmer press brings both lines low.

Figure 5:
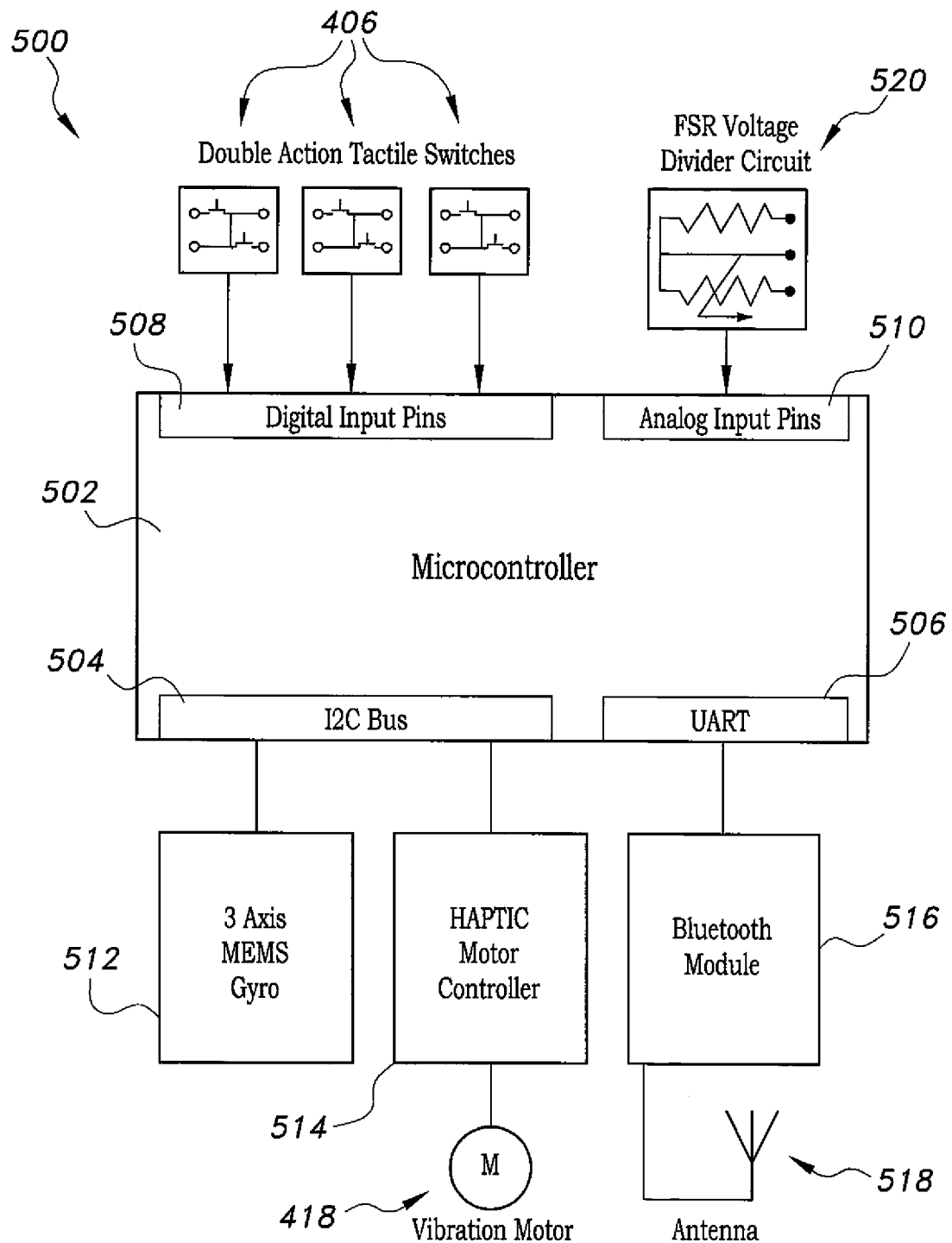
FIG. 5 is a block diagram of a circuit for an apparatus for input to electronic devices according to the present invention.

Moving on to FIG. 5, the control circuitry 500 is shown in greater detail. As mentioned previously, a gyro module 512 is capable of generating values proportional to the amount of rotational force being applied to the device for each of the three perpendicular axes. The gyro module 512 is connected to the microcontroller 502 through a digital bus 504. The gyro module 512 can be a 3-axis MEMS gyro module, and the digital bus 504 can be a 12C digital bus. An algorithm in the processor converts these force values into values representing the direction and degree of rotation of the device.

Continuing with FIG. 5, a motor controller module 514 drives a vibration motor, such as vibration motor 418, that is mechanically attached to the device case. The microcontroller 502 issues commands to the motor controller module 514 through the digital bus 504 to control the generation of various tactile sensations. These sensations are defined by the user interface. Additionally, a wireless module 516 can provide communication between the microcontroller 502 and a computer, or communication between the microcontroller 502 and a communications antenna 518.

Various further embodiments may be provided for the method and apparatus for input to electronic devices. One embodiment involves a "texter", in which an input apparatus can provide text input capability to a two-way texting device. This texter device can function as a two-way pager that communicates through a cell phone network using short message service (SMS) text messages. These cell phone service providers would be able to offer a service for a text-only device.

Another embodiment involves an input apparatus being integrated into the arm of a mobility chair. For example, a grip protrudes out of the front of a chair arm that is operated by one hand, while the forearm rests on the arm of the chair. Three potentiometers that control voltage dividers serve as the rotation sensors. A rotary potentiometer attached to a rod that is free to rotate in a bearing detects wrist rotations, while two linear potentiometers are attached to hinges that detect the bending of the wrist in the two directions. The base attaches to the bottom of the chair arm. The hinges and bearing are enclosed in a housing.

Another embodiment involves a wearable input device that integrates press gesture technology into a wearable device. In this embodiment, computer vision software uses images from a camera aimed at the fingers to sense press motions of the index, middle, and ring fingers and the thumb. It also serves as the hand movement sensor to detect the bending of the wrist. A piezoelectric actuator provides tactile feedback both for finger presses and hand movements. For example, a smart watch can have an input apparatus implemented. In this embodiment, a virtual press with the index finger initiates highlighting of the center selection. Movement of the wrist moves highlighting to selections for the setting of an alarm time and state. Releasing the virtual press toggles the highlighted selection. Selecting 'OK' commits the settings.

It is to be understood that the present invention is not limited to the embodiments described above, but encompasses any and all embodiments within the scope of the following claims.

I claim:

1. An input apparatus for electronic devices, comprising:
   a control circuit including a gyro module, and a microcontroller having a digital bus, a receiver/transmitter module, a plurality of digital input pins, and an analog input pin;
   a plurality of tactile switches in communication with the control circuit;
   a force sensitive resistor in communication with the control circuit; and
   a vibration motor in communication with the control circuit.

2. The input apparatus for electronic devices according to claim 1, wherein the gyro module is connected to the digital bus of the microcontroller.

3. The input apparatus for electronic devices according to claim 2, wherein the gyro module is a 3-axis MEMS gyro module.

4. The input apparatus for electronic devices according to claim 1, wherein each said tactile switch is connected to two of the digital input pins of the microcontroller.

5. The input apparatus for electronic devices according to claim 1, further comprising a voltage divider circuit, the force sensitive resistor being connected to the analog input pin of the microcontroller through the voltage divider circuit.

6. The input apparatus for electronic devices according to claim 1, further comprising a motor controller, the vibration motor being connected to the digital bus of the microcontroller through the motor controller.

7. The input apparatus for electronic devices according to claim 6, wherein the motor controller is a haptic motor controller.

8. The input apparatus for electronic devices according to claim 1, wherein the input apparatus further comprises a communications antenna, the communications antenna being in communication with the microcontroller.

9. The input apparatus for electronic devices according to claim 8, further comprising a wireless module, the communications antenna being connected to the receiver/transmitter module of the microcontroller through the wireless module.

10. A method for inputting into an electronic device, comprising the steps of:
    pressing a key on the electronic device to highlight a character;
    holding the key to maintain engagement of the highlighted character;
    moving the electronic device in a field of direction, each movement of the device in the field of direction corresponding to character selection such that the highlighted character continues to be highlighted or to a different character being highlighted; and
    releasing the key to select the character;
    wherein the field of direction includes forward movement, backwards movement, upward movement, downward movement, and rotation to the right and left of the electronic device.

11. A device for use in remotely inputting and controlling electronic equipment, the device consisting of:
    a control circuit having:

a microcontroller;
a digital bus;
a transceiver module for receiving from and transmitting to any electronic equipment remotely;
a plurality of digital input pins; and
an analog input pin;
a gyro module coupled to the digital bus;
a plurality of tactile switches in communication with the control circuit, each one of the plurality of tactile switches is connected to at least two of the digital input pins;
a force sensitive resistor;
a voltage divider circuit;
wherein the force sensitive resistor is in communication with the analog input pin of the control circuit via the voltage divider; and
a vibration motor in communication with the control circuit;
a motor controller electrically disposed between the vibration motor and the digital bus of the microcontroller;
a wireless module being connected to the transceiver module of the microcontroller; and
a communications antenna, the communications antenna being in communication with the microcontroller through the wireless module.

12. The device for use in remotely inputting and controlling electronic equipment according to claim 11, wherein the gyro module is a 3-axis MEMS gyro module.

13. The device for use in remotely inputting and controlling electronic equipment according to claim 11, wherein the motor controller is a haptic motor controller.

14. The device for use in remotely inputting and controlling electronic equipment according to claim 11, wherein the electronic equipment includes smart devices.

15. The device for use in remotely inputting and controlling electronic equipment according to claim 11, wherein the electronic equipment is selected from the group consisting of smart TV remotes, smart mobile phones, tablets, desk top computers, laptop computers, game consoles, media streaming devices, smart glasses, home automation, hand scanners, smart wearables, two-way texters, handheld computers, and the like.

* * * * *